United States Patent [19]

Barre

[11] Patent Number: 5,068,550
[45] Date of Patent: Nov. 26, 1991

[54] ECL-TTL SIGNAL LEVEL CONVERTER

[75] Inventor: Claude Barre, München, Fed. Rep. of Germany

[73] Assignee: Siemens Aktiengesellschaft, München, Fed. Rep. of Germany

[21] Appl. No.: 594,732

[22] Filed: Oct. 9, 1990

[30] Foreign Application Priority Data

Oct. 6, 1989 [EP] European Pat. Off. ........ 89118610.8

[51] Int. Cl.[5] ................ H03K 19/092; H03K 19/086; H03K 17/60
[52] U.S. Cl. .................................... 307/475; 307/443; 307/264; 307/356; 307/455
[58] Field of Search ................ 307/475, 264, 443, 356

[56] References Cited

U.S. PATENT DOCUMENTS

| | | | |
|---|---|---|---|
| 4,366,397 | 12/1982 | Kitamura et al. | 307/475 |
| 4,644,194 | 2/1987 | Birrittella et al. | 307/455 |
| 4,684,831 | 8/1987 | Kruest | 307/455 |
| 4,939,393 | 7/1990 | Petty | 307/475 |

Primary Examiner—John Zazworsky
Assistant Examiner—Scott A. Ouellette
Attorney, Agent, or Firm—Herbert L. Lerner; Laurence A. Greenberg

[57] ABSTRACT

An ECL-TTL signal level converter includes a first transistor pair having transistors controlled by ECL signals. A second transistor pair is connected to the transistors of the first transistor pair. Collector resistors are connected between the transistors of the second transistor pair and a first supply potential. A third transistor pair has transistors connected to the transistors of the first transistor pair. A fourth transistor pair has transistors connected to the transistors of the first transistor pair and to the transistors of the third transistor pair. A current impressing device is connected between the transistors of the fourth transistor pair and a second supply potential. A push-pull output stage is connected to the transistors of the second transistor pair for the emission of a TTL signal.

4 Claims, 1 Drawing Sheet

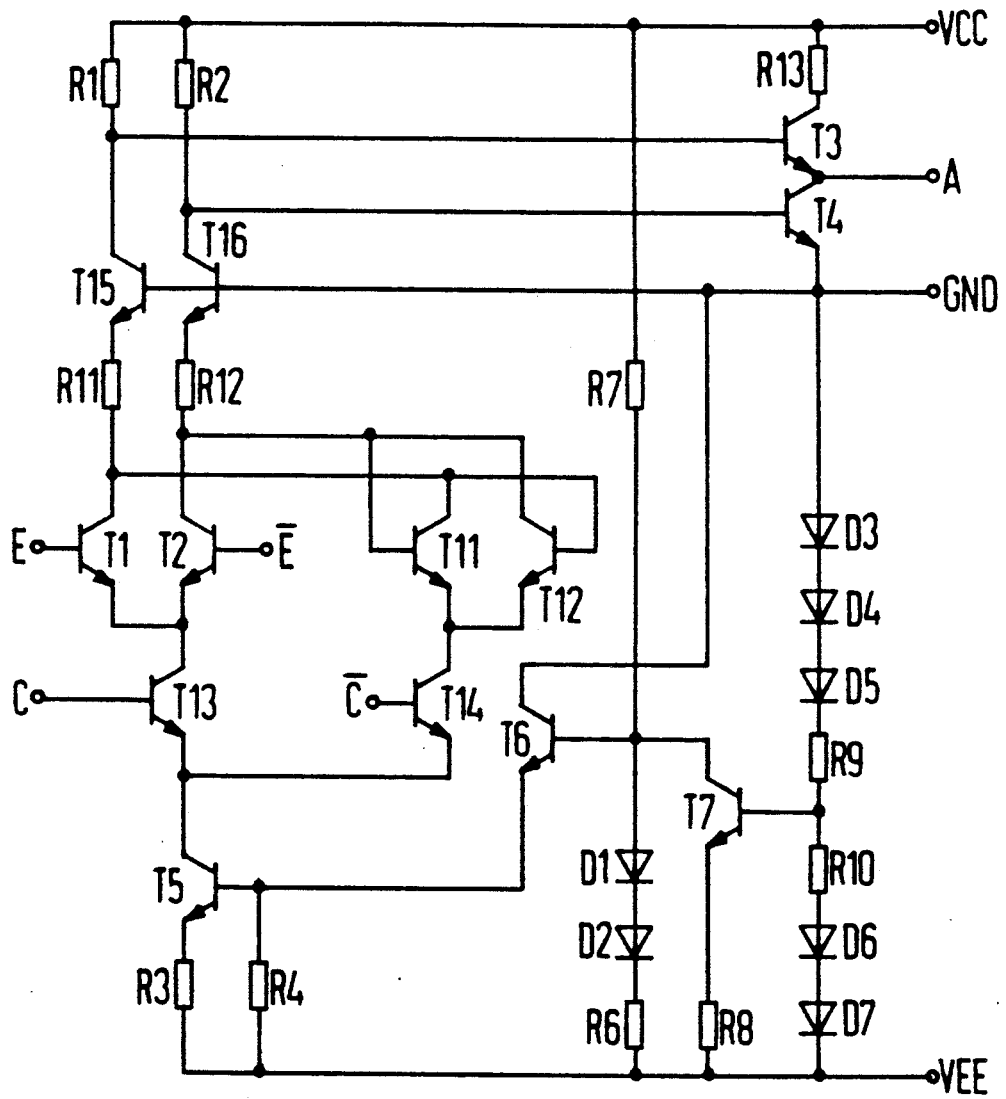

5,068,550

ECL-TTL SIGNAL LEVEL CONVERTER

BACKGROUND OF THE INVENTION

Field of the Invention

The invention relates to an ECL-TTL signal level having a first pair of transistors controlled by ECL signals with collectors to which a first supply potential is applied through respective collector resistors, and coupled emitters to which a second supply potential is applied in common through current impressing means, and a push-pull output stage connected to the collectors of the first pair of transistors for the emission of a TTL signal.

DESCRIPTION OF THE RELATED ART

ECL-TTL signal level converters are intended to convert signals derived from ECL combinatorial circuits, which have a signal rise that is characteristic of them, into signals for controlling TTL combinatorial circuits, which have a different typical signal rise. However, another important factor is that as a rule ECL combinatorial circuits require a supply potential that is negative as compared with a ground potential, while TTL combinatorial circuits require a supply potential that is positive as compared with a ground potential. Such an ECL-TTL converter is known, for instance, from German Patent DE-PS 32 43 706 Cl. another. In order to adapt the signals to one another, a memory element is therefore usually connected to the input side of the ECL-TTL signal level converter in ECL technology, and/or a memory element is connected to the output side thereof, in TTL technology.

It is accordingly an object of the invention to provide an ECL-TTL signal level converter, which overcomes the hereinafore-mentioned disadvantages of the heretofore-known devices of this general type and which has a memory function.

SUMMARY OF THE INVENTION

With the foregoing and other objects in view there is provided, in accordance with the invention, an ECL-TTL signal level converter, comprising a first transistor pair having transistors with bases controlled by ECL signals, collectors and coupled emitters; a second transistor pair having coupled bases connected to a ground potential, emitters each being connected to a respective one of the collectors of the transistors of the first transistor pair, and collectors; collector resistors each being connected between a respective one of the collectors of the transistors of the second transistor pair and a first supply potential; a third transistor pair having transistors with coupled emitters, bases and collectors, the base of one of the transistors and the collector of the other of the transistors of the third transistor pair being connected to the collector of one of the transistors of the first transistor pair, and the collector of the one transistor and the base of the other transistor of the third transistor pair being connected to the collector of the other of the transistors of the first transistor pair; a fourth transistor pair having transistors with bases controlled by control signals, coupled emitters and collectors, the collector of one of the transistors of the fourth transistor pair being connected to the coupled emitters of the transistors of the first transistor pair, and the collector of the other of the transistors of the fourth transistor pair being connected to the coupled emitters of the transistors of the third transistor pair; current impressing means connected in common between the coupled emitters of the transistors of the fourth transistor pair and a second supply potential; and a push-pull output stage connected to the collectors of the transistors of the second transistor pair for the emission of a TTL signal.

In accordance with an other feature of the invention, there are provided emitter resistors connected upstream of the emitters of the transistors of the second pair of transistors.

In accordance with a further feature of the invention, there is provided a first transistor of the current impressing means having a collector connected to the coupled emitters of the transistors of the fourth transistor pair, an emitter and a base; first and second resistors each being connected between a respective one of the emitter and the base of the first transistor and the second supply potential; a second transistor having an emitter connected to the base of the first transistor, a collector connected to the ground potential and a base; a third resistor connected between the base of the second transistor and the first supply potential, two diodes and a fourth resistor connected in series between the base of the second transistor and the second supply potential, a third transistor having a base and a collector-to-emitter path, a fifth resistor connected in series with the collector-to-emitter path of the third transistor between the base of the second transistor and the second supply potential; a series circuit of a given number of diodes and a sixth resistor connected between the base of the third transistor and ground potential, another series circuit of a predetermined number of diodes and a seventh resistor connected between the base of the third transistor and the second supply potential; and the product of the resistances of the third and the seventh resistors being equal to the product of the resistance of the fifth resistor and the sum of the resistances of the sixth and the seventh resistors.

In accordance with a concomitant feature of the invention, the given number is three, and the predetermined number is two.

The advantages of the invention are the small amount of circuitry, thus requiring little space for integration; the lower power consumption; and a shorter transit time as compared with previous versions.

Other features which are considered as characteristic for the invention are set forth in the appended claims.

Although the invention is illustrated and described herein as embodied in an ECL-TTL signal level converter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWINGS

The drawing is a schematic circuit diagram of an exemplary embodiment of the invention.

DESCRIPTION OF THE PREFERRED EMBODIMENT

Referring now to the single FIGURE of the drawing in detail, there is seen an ECL-TTL signal level converter which, like the converter known from German Patent DE-PS 32 43 706 Cl, includes a first transistor pair having transistors T1 and T2, being controlled by an ECL signal E, E̅. A positive, first supply potential VCC is applied to the collectors of the transistors T1, T2 through respective collector resistors R1, R2, and a second, negative supply potential VEE is applied to the coupled emitters thereof through common current impressing means T5, R3. In order to provide for the emission of a TTL signal A, a push-pull output stage is also provided and has a transistor T3, a transistor T4, and a resistor R13. The collector of the transistor T3 is acted upon through the resistor R13 by the positive supply potential VCC, and the emitter of the transistor T4 is acted upon by a ground potential GND. The emitter of the transistor T3 and the collector of the transistor T4 are joined together and carry the TTL signal A. The base of the transistor T3 is coupled to the collector branch of the transistor T1, and the base of the transistor T4 is coupled to the collector branch of the transistor T2.

According to the invention, the exemplary embodiment further includes a second pair of transistors, having a transistor T15 and a transistor T16, which is connected between the first transistor pair having the transistors T1, T2 and the collector resistors R1, R2. The collectors of the transistors T15 and T16 are each connected to one of the collector resistors R1 and R2, and their emitters are each connected to the collector of one of the transistors T1 and T2. The coupled bases of the transistors T15 and T16 are acted upon by the ground potential GND. An emitter-coupled third pair of transistors having a transistor T11 and a transistor T12, is additionally provided. The base of the transistor T11 as well as the collector of the transistor T12 are connected to the collector of the transistor T2, and the collector of the transistor T11 as well as the base of the transistor T12 are connected to the collector of the transistor T1. Finally, according to the invention, the exemplary embodiment also has a fourth transistor pair having transistors T13 and T14, which is connected between the first pair of transistors and the current impressing means and is controlled by control signals C, c̄. The coupled emitters of the transistor T13 and a transistor T14 are connected to the current impressing means. The collector of the transistor T13 is connected to the coupled emitters of the transistors T1 and T2. The collector of the transistor T14 is connected to the coupled emitters of the transistors T11 and T12.

According to a feature of the invention, emitter resistors R11 and R12 precede the emitters of the second transistor pair having the transistors T15, T16. This stabilizes the operating point of the first pair of transistors T1, T2 and the third pair of transistors T11, T12.

According to a further feature of the invention, a first transistor T5 is provided in the current impressing means and the collector thereof is connected to the coupled emitters of the fourth transistor pair having the transistors T13, T14. The second supply potential VEE is applied to the emitter and the base of the transistor T5 through respective first and second resistors R3, R4, and the base of the transistor T5 is connected to the emitter of a second transistor T6, which is acted upon on the collector side by the ground potential GND.

Moreover, the first supply potential VCC is applied to the base of the second transistor T6 through a third resistor R7. The second supply potential VEE is also applied to the base of the second transistor T6, on one hand through two diodes D1, D2 and a fourth resistor R6 which are connected in series, and on the other hand through the collector-to-emitter path of a third transistor T7 and a fifth resistor R8 which are also connected in series. The ground potential GND is applied to the base of a third transistor T7 through a series circuit including three diodes D3, D4, D5 and a sixth resistor R9, and the second supply potential VEE is applied to the base of the third transistor T7 through a series circuit of two diodes D6, D7 and a seventh resistor R10. The resistances are selected in such a way that the product of the third resistor R7 and the seventh resistor R10 equals the product of the fifth resistor R8 and the sum of the sixth and seventh resistors R9, R10. The advantage of this construction is that the current provided to supply the first transistor pair having the transistors T1, T2 is independent of fluctuations in temperature and supply voltage.

The mode of operation of a signal level converter according to the invention is based on the fact that in a mode when the transistor T13 is conducting and the transistor T14 is blocked, which will be called transparent operation below, it exhibits the same behavior as the known ECL-TTL signal level converter. In the reverse situation, that is in a mode when the transistor T13 is blocked and the transistor T14 is conducting, which will be called memory operation below, the signal appearing at the collectors of the transistor T1 and T2 at the instant of switchover is maintained by the interlocking transistors T11 and T12. The switchover from transparent operation to memory operation, and vice versa, is effected by means of the control signals C, C̄, which are complementary to one another. Accordingly, depending on the type of operation, either the first pair of transistors T1 and T2, or the third pair of transistors T11 and T12, is connected to the current impressing means. The result, as compared with the prior art, is the advantage that firstly the current consumption of the signal level converter according to the invention is the same for both types of operation, or in other words is not increased by the additional memory function, and secondly the transit time does not increase despite the additional memory function. Finally, because of the transistors T15 and T16, the collector potential of the transistors T1, T2, T11 and T12 never exceeds the value of the ground potential GND. In closing, it should be noted that the control signals C, C̄ or the ECL input signals E, E̅ can be either symmetrical or asymmetrical signals. The latter alternative is achieved by applying fixed reference potentials in each case, instead of complementary signals E̅, C̄.

I claim:
1. ECL-TTL signal level converter, comprising:
   a first transistor pair having transistors with bases controlled by ECL signals, collectors and coupled emitters;
   a second transistor pair having coupled bases connected to a ground potential, emitters each being connected to a respective one of the collectors of said transistors of said first transistor pair, and collectors;

collector resistors each being connected between a respective one of the collectors of said transistors of said second transistor pair and a first supply potential;

a third transistor pair having transistors with coupled emitters, bases and collectors, the base of one of said transistors and the collector of the other of said transistors of said third transistor pair being connected to the collector of one of said transistors of said first transistor pair, and the collector of said one transistor and the base of said other transistor of said third transistor pair being connected to the collector of the other of said transistors of said first transistor pair;

a fourth transistor pair having transistors with bases controlled by control signals, coupled emitters and collectors, the collector of one of said transistors of said fourth transistor pair being connected to the coupled emitters of said transistors of said first transistor pair, and the collector of the other of said transistors of said fourth transistor pair being connected to the coupled emitters of said transistors of said third transistor pair;

current impressing means connected in common between the coupled emitters of said transistors of said fourth transistor pair and a second supply potential; and a push-pull output stage connected to the collectors of said transistors of said second transistor pair for the emission of a TTL signal.

2. ECL-TTL signal level converter according to claim 1, including emitter resistors connected upstream of the emitters of said transistors of said second pair of transistors.

3. ECL-TTL signal level converter according to claim 1, including a first transistor of said current impressing means having a collector connected to the coupled emitters of said transistors of said fourth transistor pair, an emitter and a base;

first and second resistors each being connected between a respective one of the emitter and the base of said first transistor and the second supply potential;

a second transistor having an emitter connected to the base of said first transistor, a collector connected to the ground potential and a base;

a third resistor connected between the base of said second transistor and the first supply potential, two diodes and a fourth resistor connected in series between the base of said second transistor and the second supply potential, a third transistor having a base and a collector-to-emitter path, a fifth resistor connected in series with the collector-to-emitter path of said third transistor between the base of said second transistor and the second supply potential;

a series circuit of a given number of diodes and a sixth resistor connected between the base of said third transistor and ground potential, another series circuit of a predetermined number of diodes and a seventh resistor connected between the base of said third transistor and the second supply potential; and the product of the resistances of said third and said seventh resistors being equal to the product of the resistance of said fifth resistor and the sum of the resistances of said sixth and said seventh resistors.

4. ECL-TTL signal level converter according to claim 3, wherein said given number is three, and said predetermined number is two.

* * * * *